US008209592B2

(12) United States Patent
Pisek et al.

(10) Patent No.: US 8,209,592 B2
(45) Date of Patent: Jun. 26, 2012

(54) METHOD AND APPARATUS FOR SOFTWARE-DEFINED RADIO LDPC DECODER

(75) Inventors: Eran Pisek, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 799 days.

(21) Appl. No.: 12/378,747

(22) Filed: Feb. 19, 2009

(65) Prior Publication Data

US 2009/0319856 A1 Dec. 24, 2009

Related U.S. Application Data

(60) Provisional application No. 61/132,656, filed on Jun. 20, 2008.

(51) Int. Cl.
*G06F 11/00* (2006.01)
*H03M 13/00* (2006.01)

(52) U.S. Cl. ........................................................ 714/801

(58) Field of Classification Search .................. 714/746, 714/752, 786, 800–801, 807
See application file for complete search history.

(56) References Cited

U.S. PATENT DOCUMENTS 6,633,856 B2 * 10/2003 Richardson et al. ............ 706/15
6,957,375 B2 * 10/2005 Richardson ................... 714/752
* cited by examiner

*Primary Examiner* — Shelly A Chase

(57) ABSTRACT

A method and apparatus for decoding transmissions in a wireless communications network is provided. A receiver includes a receive path. The receive path includes a low density parity check (LDPC) decoder. The receiver is configured to receive encoded transmissions and perform low density parity check decoding operations using a CRISP decoder. The CRISP decoder includes a plurality of memory units, and a plurality of processors.

20 Claims, 10 Drawing Sheets

500

505 510

515 520 525

RATE 1/2:

| | | | | | | | | | | | | | | | | | | | | | | | | |
|---|---|---|---|---|---|---|---|---|---|---|---|---|---|---|---|---|---|---|---|---|---|---|---|---|
| -1 | 94 | 73 | -1 | -1 | -1 | -1 | -1 | 55 | 83 | -1 | -1 | ¦ | 7 | 0 | -1 | -1 | -1 | -1 | -1 | -1 | -1 | -1 | -1 | -1 |
| -1 | 27 | -1 | -1 | -1 | 22 | 79 | 9 | -1 | -1 | -1 | 12 | ¦ | -1 | 0 | 0 | -1 | -1 | -1 | -1 | -1 | -1 | -1 | -1 | -1 |
| -1 | -1 | -1 | 24 | 22 | 81 | -1 | 33 | -1 | -1 | -1 | 0 | ¦ | -1 | -1 | 0 | 0 | -1 | -1 | -1 | -1 | -1 | -1 | -1 | -1 |
| 61 | -1 | 47 | -1 | -1 | -1 | -1 | -1 | 65 | 25 | -1 | -1 | ¦ | -1 | -1 | -1 | 0 | 0 | -1 | -1 | -1 | -1 | -1 | -1 | -1 |
| -1 | -1 | 39 | -1 | -1 | -1 | 84 | -1 | -1 | 41 | 72 | -1 | ¦ | -1 | -1 | -1 | -1 | 0 | 0 | -1 | -1 | -1 | -1 | -1 | -1 |
| -1 | -1 | -1 | -1 | 46 | 40 | -1 | 82 | -1 | -1 | -1 | 79 | ¦ | 0 | -1 | -1 | -1 | -1 | 0 | 0 | -1 | -1 | -1 | -1 | -1 |
| -1 | -1 | 95 | 53 | -1 | -1 | -1 | -1 | -1 | 14 | 18 | -1 | ¦ | -1 | -1 | -1 | -1 | -1 | -1 | 0 | 0 | -1 | -1 | -1 | -1 |
| -1 | 11 | 73 | -1 | -1 | -1 | 2 | -1 | -1 | 47 | -1 | -1 | ¦ | -1 | -1 | -1 | -1 | -1 | -1 | -1 | 0 | 0 | -1 | -1 | -1 |
| 12 | -1 | -1 | -1 | 83 | 24 | -1 | 43 | -1 | -1 | -1 | 51 | ¦ | -1 | -1 | -1 | -1 | -1 | -1 | -1 | -1 | 0 | 0 | -1 | -1 |
| -1 | -1 | -1 | -1 | -1 | 94 | -1 | 59 | -1 | -1 | 70 | 72 | ¦ | -1 | -1 | -1 | -1 | -1 | -1 | -1 | -1 | -1 | 0 | 0 | -1 |
| -1 | -1 | 7 | 65 | -1 | -1 | -1 | -1 | 39 | 49 | -1 | -1 | ¦ | -1 | -1 | -1 | -1 | -1 | -1 | -1 | -1 | -1 | -1 | 0 | 0 |
| 43 | -1 | -1 | -1 | -1 | 66 | -1 | 41 | -1 | -1 | -1 | 26 | ¦ | 7 | -1 | -1 | -1 | -1 | -1 | -1 | -1 | -1 | -1 | -1 | 0 |

RATE 5/6 CODE:

565

| | | | | | | | | | | | | | | | | | | | | | | | | |
|---|---|---|---|---|---|---|---|---|---|---|---|---|---|---|---|---|---|---|---|---|---|---|---|---|
| 1 | 25 | 55 | -1 | 47 | 4 | -1 | 91 | 84 | 8 | 86 | 52 | 82 | 33 | 5 | 0 | 36 | 20 | 4 | 77 | ¦ | 80 | 0 | -1 | -1 |
| -1 | 6 | -1 | 36 | 40 | 47 | 12 | 79 | 47 | -1 | 41 | 21 | 12 | 71 | 14 | 72 | 0 | 44 | 49 | 0 | ¦ | 0 | 0 | 0 | -1 |
| 51 | 81 | 83 | 4 | 67 | -1 | 21 | -1 | 31 | 24 | 91 | 61 | 81 | 9 | 86 | 78 | 60 | 88 | 67 | 15 | ¦ | -1 | -1 | 0 | 0 |
| 50 | -1 | 50 | 15 | -1 | 36 | 13 | 10 | 11 | 20 | 53 | 90 | 29 | 92 | 57 | 30 | 84 | 92 | 11 | 66 | ¦ | 80 | -1 | -1 | 0 |

FIG. 5B

METHOD AND APPARATUS FOR SOFTWARE-DEFINED RADIO LDPC DECODER

CROSS-REFERENCE TO RELATED APPLICATION(S) AND CLAIM OF PRIORITY

The present application is related to U.S. Provisional Patent No. 61/132,656, filed Jun. 20, 2008, entitled "METHOD AND APPARATUS FOR SOFTWARE-DEFINED RADIO LDPC DECODER" and U.S. Non-provisional patent application Ser. No. 12/378,775, entitled "METHOD AND APPARATUS FOR PARALLEL PROCESSING MULTIMODE LDPC DECODER" filed concurrently herewith. Provisional Patent No. 61/132,656 is assigned to the assignee of the present application and is hereby incorporated by reference into the present application as if fully set forth herein. The present application hereby claims priority under 35 U.S.C. §119(e) to U.S. Provisional Patent No. 61/132,656.

TECHNICAL FIELD OF THE INVENTION

The present application relates generally to wireless communications devices and, more specifically, to decoding data received by a wireless communication device.

BACKGROUND OF THE INVENTION

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

SUMMARY OF THE INVENTION

A receiver, for use in a wireless communications network, capable of decoding encoded transmissions is provided. The receiver comprises a number of receive antennas; and a low density parity check decoder. The low density parity check decoder includes a plurality of memory units, a plurality of processors, and a programmable finite state machine. The programmable finite state machine is capable of controlling a reconfigurable data path, wherein the programmable finite state machine is capable of executing a plurality of context-related instructions associated with the low density parity check decoder. The low density parity check decoder is configured to perform low density parity check decoding operation.

A decoder in a wireless communications device capable of decoding encoded transmissions in a wireless communications network is provided. The decoder includes a plurality of memory units; a processor array; and a plurality of instructions. At least a portion of the plurality of instructions is stored in an instruction controller. The controller is capable of controlling a reconfigurable data path and executing a plurality of context-related instructions in the plurality of instructions to cause said processor array to perform a low density parity check decoding operation.

A method for decoding transmissions in a wireless communications network is provided. The method includes receiving a data transmission. The method also includes performing a low density parity check decoding operation using a CRISP decoder. The CRISP decoder includes a plurality of memory units, a plurality of processors, and a programmable finite state machine capable of controlling a reconfigurable data path. The programmable finite state machine is capable of executing a plurality of context-related instructions to cause the reconfigurable decoder to perform the low density parity check decoding operation.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5A illustrates a rate ½ code according to embodiments of the present disclosure;

FIG. 5B illustrates a rate ⅚ code according to embodiments of the present disclosure;

DETAILED DESCRIPTION OF THE INVENTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications device.

Figure 1:
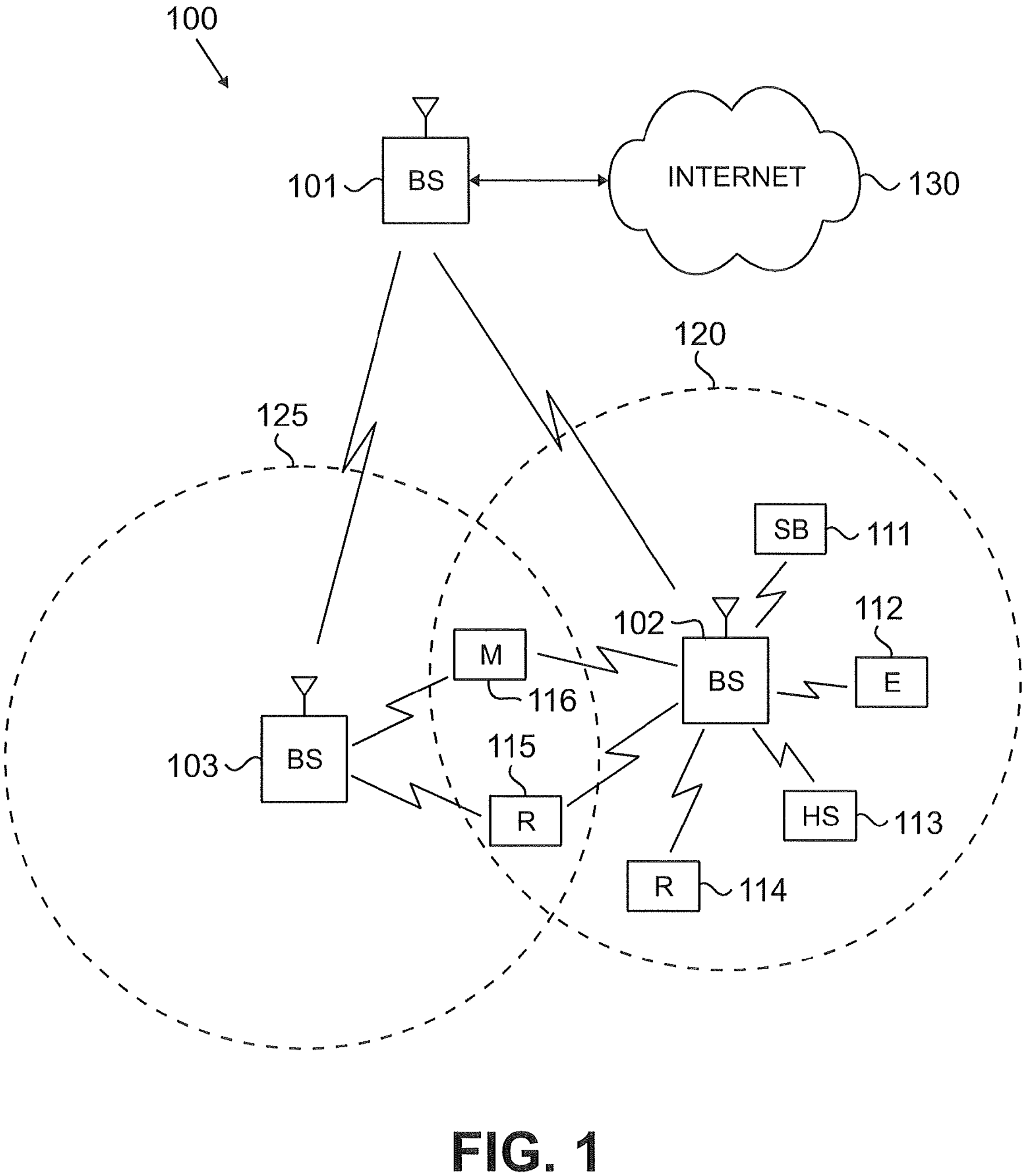
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
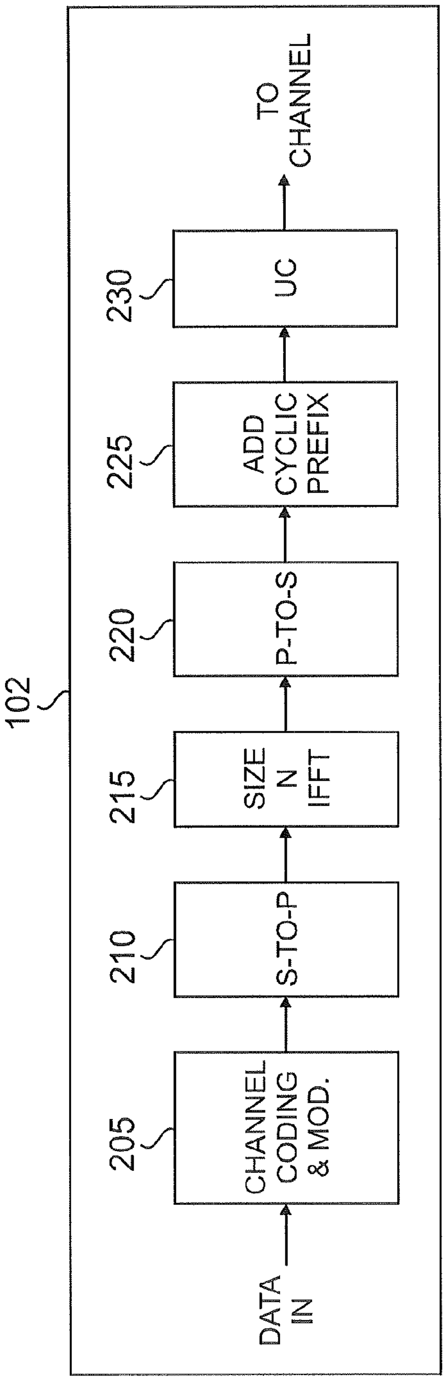
FIG. 2A illustrates a high-level diagram of an orthogonal frequency division multiple access transmit path according to an exemplary embodiment of the disclosure.
Figure 2B:
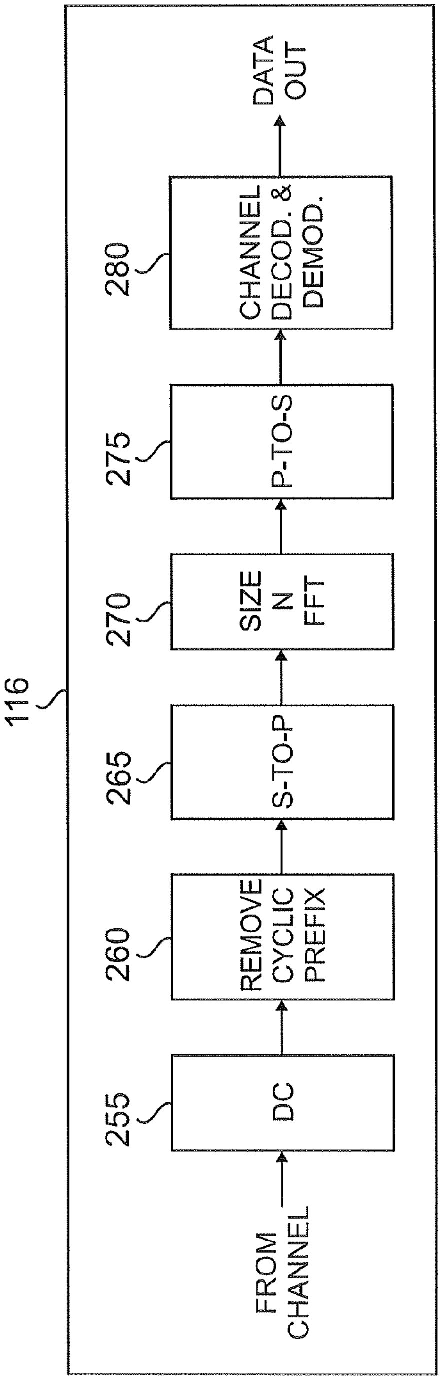
FIG. 2B illustrates a high-level diagram of an orthogonal frequency division multiple access receive path according to an exemplary embodiment of the disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., LDPC coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

Figure 3:
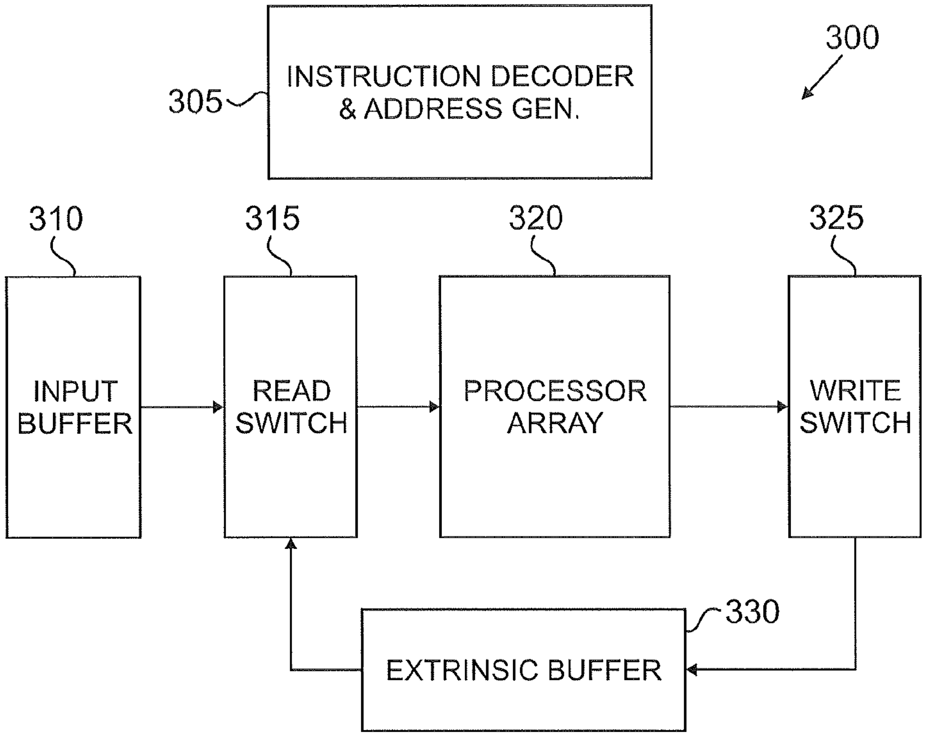
FIG. 3 illustrates a LDPC CRISP top-level architecture according to embodiments of the present disclosure.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more Context-based operation Reconfigurable Instruction Set Processors (CRISPs) such as the CRISP processor described in one or more of application Ser. No. 11/123,313 (now U.S. Pat. No. 7,668,992) filed May 6, 2005, entitled "CONTEXT-BASED OPERATION RECONFIGURABLE INSTRUCTION SET PROCESSOR AND METHOD OF OPERATION"; U.S. Pat. No. 7,483,933 issued Jan. 27, 2009 entitled "CORRELATION ARCHITECTURE FOR USE IN SOFTWARE-DEFINED RADIO SYSTEMS"; application Ser. No. 11/142,504 (now U.S. Pat. No. 7,769,912) filed Jun. 1, 2005, entitled "MULTISTANDARD SDR ARCHITECTURE USING CONTEXT-BASED OPERATION RECONFIGURABLE INSTRUCTION SET PROCESSORS"; application Ser. No. 11/225,479 (now U.S. Pat. No. 7,571,369) filed Sep. 13, 2005, entitled "TURBO CODE DECODER ARCHITECTURE FOR USE IN SOFTWARE-DEFINED RADIO SYSTEMS"; and application Ser. No. 11/501,577 (now U.S. Pat. No. 7,864,832) filed Aug. 9, 2006, entitled "MULTI-CODE CORRELATION ARCHITECTURE FOR USE IN SOFTWARE-DEFINED RADIO SYSTEMS", all of which are hereby incorporated by reference into the present application as if fully set forth herein:

FIG. 3 illustrates a LDPC CRISP top-level architecture according to embodiments of the present disclosure. The embodiment of the LDPC CRISP top-level architecture 300 shown in FIG. 3 is for illustration only. Other embodiments of the LDPC CRISP top-level architecture 300 could be used without departing from the scope of this disclosure.

The LDPC CRISP 300 includes an instruction decoder & address generator block 305. In some embodiments, the instruction decoder & address generator block 305 is a programmable finite state machine. In some embodiments, the instruction decoder & address generator block 305 operates as a controller for the LDPC CRISP 300 and its components. The LDPC CRISP 300 also includes an input buffer block 310, a read switch block 315, a processor array 320, a write switch block 325 and an extrinsic buffer block 330. In some embodiments (not specifically illustrated), the input buffer block 310 includes extrinsic buffer block 330 (e.g., the input buffer block 310 and extrinsic buffer 330 can be the same block).

The instruction decoder & address generator block 305 includes a plurality of instructions to control operations of the LDPC CRISP 300. In some embodiments, a portion (e.g., some or all) of the plurality of instructions is reconfigurable to vary the operation of the LDPC CRISP 300. The plurality of instructions can be reconfigured to have the LDPC CRISP 300 perform Serial V decoding or Serial-C decoding. Additionally, the plurality of instructions can be reconfigured to have the LDPC CRISP 300 perform decoding by a flooding technique, sum products technique or min-sum technique. The plurality of instructions also can be reconfigured to vary a number of iterations performed such that the LDPC CRISP 300 only performs a number of iterations or continue to perform iterations until a specified event occurs or a specified amount of time lapses. Further, the plurality of instructions can be reconfigured to have the LDPC CRISP 300 perform decoding for any one or more of IEEE 802.16e (hereinafter "WiMax"), Digital Video Broadcasting—Satellite—Second Generation (hereinafter "DVB-S2") and International Mobile Telecommunications—Advanced (hereinafter "IMT-Advanced" or "4G"). The LDPC CRISP can be applied to any system that incorporates an LDPC decoding algorithm including, but not limited to, CDMA, OFDMA, WiMax, third generation (3G) and 4G systems. Additionally, the plurality of instructions can be reconfigured to have the LDPC CRISP 300 vary the number of LDPC CRISP decoder units for use in the decoding operation. The instruction decoder & address generator block 305 also is configured to store an H-matrix (discussed herein below with respect to FIGS. 5A and 5B).

The input buffer block 310 is configured to receive data (e.g., codewords or symbols). The input buffer block 310 includes a number of memory blocks for storing the received data. In some embodiments, the input buffer block 310 includes twenty-four (24) memory blocks for storing the received data.

The read switch also reads the H-matrix from the instruction decoder & address generator block 305. The read switch 315 is configured to read the received data from the input buffer block 310. The read switch 315 uses the H-matrix to determine from where to read the data from the input buffer 310. The read switch 315 is configured to apply a Z-factor right shift multiplexor (MUX) operation to the received data read from the input buffer block 310. The Z-factor right shift multiplexor (MUX) operation is based on the shift data computed from the H-matrix or the shift vector (discussed herein below with respect to FIGS. 5A and 5B).

The processor array 320 includes a number of processor elements. Each of the processor elements includes a plurality of processors configured to perform a flooding technique, sum products technique or min-sum technique. For example, the processor 320 can be configured to find minimum values using a min-sum technique. Further, the processor array 320 is configured to perform decoding for any one or more of WiMax, DVB-S2 and 4G. In some embodiments, the processor array 320 includes four (4) processor elements, each processor element including twenty-four (24) processors. In such embodiments, the LDPC CRISP 300 is referenced herein as a 2/4-unit LDPC decoder CRISP 300.

The write switch block 325 is configured to receive Min/Next Min selection & sums from the processor array 320. The write switch block 325 further is configured to apply a Z-factor left shift MUX operation to the Min/Next Min selection & sums received from the processor array 320 to generate a set of output extrinsic data. Further, the write switch block 325 is configured to write the output extrinsic data of the write switch block 325 to extrinsic buffer block 330. For example, the write switch block 325 is configured to use the H-matrix to reverse of the operation performed by read switch 315.

The extrinsic buffer block 330 is configured to store the output extrinsic data in a number of memory units. In some embodiments, the extrinsic buffer block 330 includes twenty-four (24) memory units. The extrinsic buffer block 330 also is coupled to the read switch 315 such that the read switch 315 can read the output extrinsic data (hereinafter also "extrinsic output").

The LDPC CRISP 300 is, thus, able to perform a number of iterations of the received data. The LDPC CRISP 300 is operable to read the input data and apply a decoding process to the input data to output an extrinsic data. Thereafter, the LDPC CRISP 300 performs one or more iterations of the decoding process using extrinsic data from the previous decoding process as the input for the next decoding process. As such, the input data is used only once and, thereafter, the LDPC CRISP 300 generates the extrinsic data for use in the subsequent iterations.

The LDPC CRISP 300 can be configured to perform iterations until a cessation event occurs. For example, the LDPC CRISP 300 can be configured to perform a specified number of iterations. Additionally, the LDPC CRISP 300 can be configured to perform iterations until the extrinsic data reaches a specified value (e.g., a convergence point). Further, the LDPC CRISP 300 can be configured to perform iterations until a most significant bit (MSB) output is unchanged for several consecutive iterations.

LDPC codes are linear codes that can be characterized by sparse parity check matrices H. The H-matrix has a low density of one's (1's). The sparseness of H yields a large $d_{min}$ and reduces decoding complexity. An exemplary H-matrix is represented by Equation 1:

$$H = \begin{bmatrix} 1 & 1 & 1 & 1 & 0 & 1 & 0 & 1 & 0 & 1 \\ 1 & 0 & 1 & 1 & 0 & 0 & 1 & 1 & 1 & 1 \\ 0 & 1 & 0 & 1 & 0 & 0 & 0 & 1 & 0 & 0 \\ 1 & 0 & 0 & 0 & 1 & 0 & 1 & 1 & 1 & 1 \\ 0 & 0 & 1 & 1 & 1 & 0 & 1 & 0 & 1 & 0 \end{bmatrix}. \quad \text{[Eqn. 1]}$$

An LDPC code is regular if: every row has the same weight, $W_r$; and every column has the same weight, $W_c$. The regular LDPC code is denoted by $(W_x, W_r)$-regular. Otherwise, the LDPC code is irregular. Regular codes are easier to implement and analyze. Further, regular codes have lower error floors. However, irregular codes can get closer to capacity than regular codes.

Figure 4:
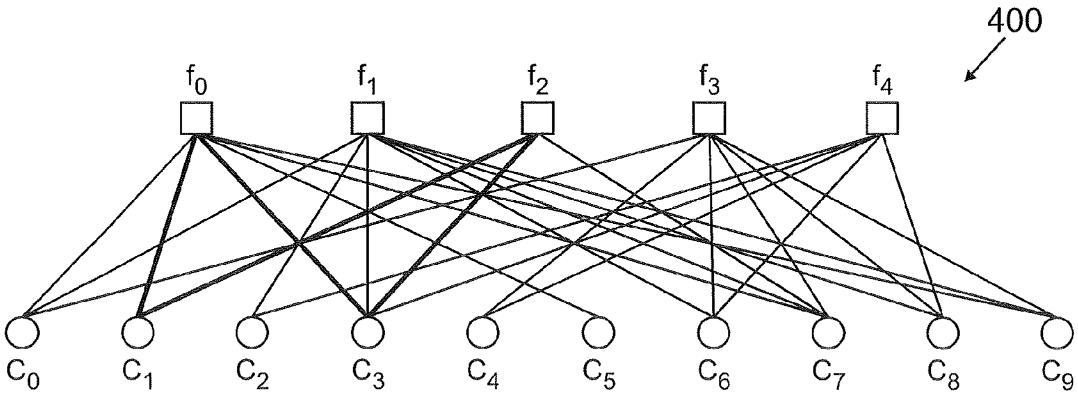
FIG. 4 illustrates a Tanner graph corresponding to a parity check matrix according to embodiments of the present disclosure.

FIG. 4 illustrates a Tanner graph corresponding to a parity check matrix according to embodiments of the present disclosure. The embodiment of the Tanner graph 400 shown in FIG. 4 is for illustration only. Other embodiments of the Tanner graph 400 could be used without departing from the scope of this disclosure.

The Tanner graph 400 is a bipartite graph. In bipartite graphs, nodes are separated into two distinctive sets and edges are only connecting nodes of two different types. The two types of nodes in the Tanner graph 400 are referred to as Variable Nodes (hereinafter "v-nodes") and Check Nodes (hereinafter "c-nodes")

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

The Tanner graph 400 corresponds to the parity check H-matrix illustrated by Equation 1. The Tanner graph 400 includes five (5) c-nodes (the number of parity bits) and ten (10) v-nodes (the number of bits in a codeword). C-node $f_i$ is connected to v-node $c_j$ if the element $h_{ij}$ of H-matrix is a one (1). For example, c-node $f_0$ is connected $c_0$, $c_1$, $c_2$, $c_3$, $c_5$, $c_7$ and $c_9$. The connection between $f_0$ and $c_0$ corresponds to $h_{01}$; the connection between $f_0$ and $c_2$ corresponds to $h_{01}$; and so on. Therefore, the connections to $f_0$ correspond to the first row in the H-matrix, further illustrated in Equation 2:

$$\vec{H}_0=[1\ 1\ 1\ 1\ 0\ 1\ 0\ 1\ 0\ 1]. \quad \text{[Eqn. 2]}$$

A degree of a node is the number of edges (e.g., connections) connected to the node. A cycle is a total length, in the Tanner graph 400, of a path of distinct edges that closes upon itself. A path from $c_1 \rightarrow f_2 \rightarrow c_2 \rightarrow f_0 \rightarrow c_1$ is an example of a short cycle. Short cycles should be avoided since short cycles adversely affect decoding performance. Short cycles manifest themselves in the H-matrix by columns with an overlap two (2).

In some embodiments, the LDPC CRISP 300 uses a sum-product process to decode the LDPC codes. In some such embodiments, a hard-decision decoding is performed. In other such embodiments, a soft-decision decoding is performed. In additional and alternative embodiments, the LDPC CRISP 300 uses a min-sum process.

The LDPC CRISP 300 is configured as a universal decoder for use with multiple transmission standards including, but not limited to, WiMax, DVB-S2 and 4G. The LDPC is configured to use a number of rate codes including, but not limited to, ¼ rate code, ½ rate code, ⅔ rate code, ¾ rate code and ⅚ rate code.

FIG. 5A illustrates a rate ½ code according to embodiments of the present disclosure. The embodiment of the rate ½ code 500 shown in FIG. 5A is for illustration only. Other embodiments of the rate ½ code 500 could be used without departing from the scope of this disclosure.

In some embodiments, the parity check H-matrix stored in a receive path, (e.g., stored in channel decoder and demodulator 280) can be configured according to the rate ½ code 500. The rate ½ code 500 is a 576×288 matrix that represents a transmission of five hundred seventy-six (576) Bits Per Frame (bpf). In the rate ½ code 500, the first twelve (12) columns 505 represent data bits while the second twelve (12) columns 510 represent redundancy bits. Further each bit is a location bit that represents a 24×24 matrix. The Z-factor defines the number of bits per matrix. For example, the Z-Factor can be twenty-four (24). As such using the rate ½ code 500, each frame in the transmission includes two-hundred eighty-eight (288) bits of data and two-hundred eighty-eight (288) redundancy bits. A "−1-1" value represents a zero (0) matrix. Accordingly, a "−1" value indicates that the location is not used. The remaining values, other than "−1", are location values that represent a matrix. For example, the matrix represented by the location value "94", found in $h_{01}$ 515, is divided by four (4) and rounded-down to yield a twenty-three (23). Thereafter, the unity matrix is shifted twenty-three times.

FIG. 5B illustrates a rate ⅚ code according to embodiments of the present disclosure. The embodiment of the rate ⅚ code 550 shown in FIG. 5B is for illustration only. Other embodiments of the rate ⅚ code 550 could be used without departing from the scope of this disclosure.

In some embodiments, the parity check H-matrix can be configured according to the rate ⅚ code 550. The rate ⅚ code 550 is a 576×288 matrix that represents a transmission of five hundred seventy-six (576) bpf. In the rate ⅚ code 550, the first twenty (20) columns 555 represent data bits while the last four (4) columns 560 represent redundancy bits. As such, using the rate ⅚ code 550, each frame in the transmission includes four-hundred eighty (480) bits of data and ninety-six (96) redundancy bits. A "−1" value represents a zero (0) 24×24 matrix. Accordingly, a "−1" value indicates that the bit is not used. The remaining values, other than "−1", are location values that represent a matrix. For example, the matrix represented by the location value "25", found in $h_{01}$ 565, is divided by four (4) to and rounded down to yield a six (6). Thereafter, the unity matrix is shifted six times.

In some embodiments, a 4G H-matrix comprises two vectors. In such embodiments, the first vector includes only the location values while the second vector includes a shift value. For example, the location vector for the first row of the H-Matrix 500 is illustrated by Equation 3:

$$H_0=[1\ 2\ 8\ 9\ 12\ 13]. \qquad \text{[Eqn. 3]}$$

Each value in the vector $H_0$ illustrated in Equation 3 represents a non-zero (e.g., not "−1") column position for row 0. Additionally, the second vector (referenced herein as $H_{s0}$), containing the shift values for the H-Matrix 500, is illustrated by Equation 4:

$$H_{s0}=\left[\frac{94}{4}\ \frac{73}{4}\ \frac{55}{4}\ \frac{83}{4}\ \frac{7}{4}\ \frac{0}{4}\right]. \qquad \text{[Eqn. 4]}$$

Solving for the fractions, Equation 4 can be written as Equation 5:

$$H_{s0}=[23\ 18\ 13\ 20\ 1\ 0]. \qquad \text{[Eqn. 5]}$$

Figure 6:
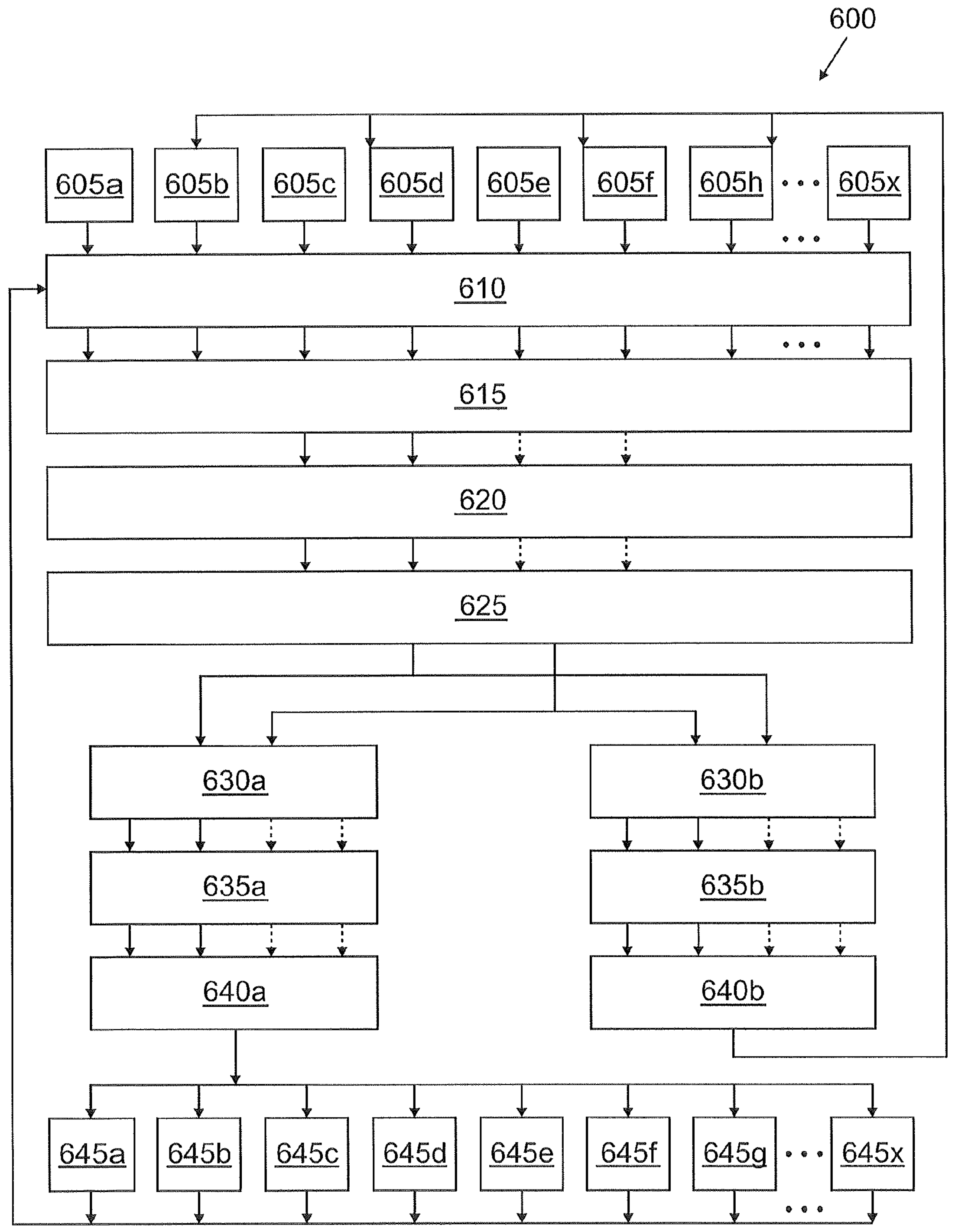
FIG. 6 illustrates a more detailed block diagram of an exemplary serial-v LDPC CRISP according to embodiments of the present disclosure.

FIG. 6 illustrates a more detailed block diagram of an exemplary serial-v LDPC CRISP according to embodiments of the present disclosure. The embodiment of the serial-v LDPC CRISP 600 shown in FIG. 6 is for illustration only. Other embodiments of the serial-v LDPC CRISP 600 could be used without departing from the scope of this disclosure.

The serial-v LDPC CRISP 600 can include the same general structure as ²⁄₄-unit LDPC CRISP 300. The serial-v LDPC CRISP 600 includes an input buffer comprising a plurality of individual memory units 605. The individual memory units 605 are a plurality of separate and distinct memory devices that are each capable of receiving data to independent data write operations occurring the remaining individual memory units 605. In some embodiments, the serial-v LDPC CRISP 600 includes twenty-four (24) memory units 605*a*-605*x*. It will be understood that the illustration of twenty-four memory units merely is exemplary and the plurality of memory units 605 can include any number of memory units. The memory units 605 are configured to store data received via the receive path (discussed herein above with respect to FIG. 2B). As such, the serial-v LDPC CRISP 600 is configured to read twenty-four data simultaneously (as opposed to only one data at a time if using only one memory unit).

For example, each memory unit 605 can receive a data from the receive path. In such example, since each memory unit 605 receives 24 bits of data, when memory unit 605*b* receives the data, the memory unit 605*b* is receiving data bits 24-47 at a time $t_0$. Additionally, the memory unit 605*c* would receive data bits 48-71 at the time $t_0$ and memory unit 605*i* (not illustrated) would receive data bits 192-215 at the time $t_0$. Therefore, the memory units 605*a*-605*x* can receive five hundred seventy six (576) bits of data simultaneously. It should be noted that in some examples, a transmission may comprise less than 576 bits of data. As such, the memory units are configured to receive and store a number of bits per frame up to 576 bits per frame. Depending upon the block size, data may be distributed to different memory banks 605.

In some embodiments, each memory unit 605 includes six (6) memory banks (not specifically illustrated). In some embodiments, each memory unit 605 includes eight (8) memory banks (discussed in further detail herein below with respect to FIG. 8).

The serial-v LDPC CRISP 600 also includes an extrinsic/row subtractor block 610. The extrinsic/row subtractor block 610 is configured to remove at least a portion of extrinsic data stored in the memory banks by write switch 640.

The serial-v LDPC CRISP 600 also includes a 24-to-2(4) read switch 615. The read switch 615 is configured to read the received data, minus the portion of subtracted extrinsic data removed by the extrinsic/row subtractor block 610, from the memory banks 605. The read switch 615 selects and aligns N variable inputs from the twenty-four input/extrinsic data per row. N corresponds to the number of processors elements (e.g., processors) operating in a processor array 625.

Further, the serial-v LDPC CRISP 600 includes a Z-factor right shift MUX block 620. The Z-factor right shift MUX block 620 is configured to apply a Z-factor right shift MUX operation to the received data read from the memory banks 605. After selecting the N inputs/extrinsic outputs, the Z-factor right shift MUX block 620 aligns (i.e., Z-shifts) the N inputs/extrinsic outputs based on the H-matrix.

For example, the Z-factor shift is applied to the data in each memory unit 605 according to the H-matrix 500 (e.g., data in memory unit 605*b* is processed based the location value "94", found in $h_{01}$ 515). In such example, since each location value corresponds to a 24×24 matrix (e.g., 24 bits of data), all twenty-four bits of data in memory unit 605*b* are processed based on the location value "194", found in $h_{01}$ 515, e.g., data bits 24-47 are shifted at a time $t_{0+p}$. Additionally, all twenty-four bits of data in the memory unit 605*c* would are processed based on the location value "73" $h_{02}$ 520. As such data bits 48-71 are shifted at the time $t_{0+q}$. All the data bits in memory unit 605*i* (not illustrated) would be processed according to location value "55" in $h_{08}$ 525. As such data bits 192-215 are shifted at the time $t_{0+r}$. Therefore, the all the data in memory units 605*a*-605*x* are shifted based on the H-matrix The processor array 625 includes a number of processors configured to perform a flooding technique, sum products technique or min-sum technique. Processor array can include the same structure and function as processor array 320 illustrated in FIG. 3. For example, the processor array 625 can be configured to find minimum values using a min-sum technique. Further, the processor array 625 is configured to perform decoding for any one or more of WiMax, DVB-S2 and 4G. Each of the processors in the processor array 625 is configured to apply a different equation as represented by the H-matrix 500. In some embodiments, the processor array comprises twenty-four (24) processors. In some additional and alternative embodiments, the processor array 625 includes ²⁄₄ units with twenty-four (24) processors contained in each ²⁄₄ unit. Each of the processors in the processor array is configured to read from each of the memory units 605*a*-

605*x* such that all the data stored in one of the memory units 605*a*-605*x* is processed using a different equation simultaneously. For example, a first processor is configured to read a first data from the second memory unit 605*b* at a time $t_1$; a second processor will read a second data from the second memory unit 605*b* at the time $t_1$; a third processor will read a third data from the second memory unit 605*b* at the time $t_1$, etc. In a second cycle (e.g., time $t_2$), the first processor reads a first data from the third memory unit 605*c* at a time $t_2$; the second processor reads a second data from the third memory unit 605*c* at the time $t_2$; the third processor will read a third data from the third memory unit 605*c* at the time $t_2$, etc. In the embodiments wherein the memory units 605*a*-605*x* comprise multiple banks, the multiple processors read from one bank (e.g., bank0) at the time $t_1$ and read from the next bank (e.g., bank1) at a subsequent time, e.g., after all data from bank0 has been read from each of the memory units 605*a*-605*x*.

The processor array 625 is dependent upon the number of Z-factor columns processed per cycle. In some embodiments, the processor array 625 is configured to output a minimum value (min) and a next minimum value (next min) corresponding to the smallest bit value and second smallest bit value respectively. The processor array 625 stores the min and next min values in one or more registers. The one or more registers are included in the processor array 625.

The serial-v LDPC CRISP 600 includes a number of selection and sum blocks 630. In some embodiments, the serial-v LDPC CRISP 600 includes a first selection and sum block 630*a* and a second selection and sum block 630*b*. Each of the number of selection and sum blocks 630 is configured to perform a min/next min selection and sum operation. In some embodiments, the first selection and sum block 630*a* is configured to perform the min/next min selection and sum operation on a first check node while the second selection and sum block 630*b* is configured to perform the min/next min selection and sum operation on a second check node.

The serial-v LDPC CRISP 600 further includes a number of Z-factor left shift MUX blocks 635. In some embodiments, the serial-v LDPC CRISP 600 includes a first Z-factor left shift MUX blocks 635*a* and a second Z-factor left shift MUX blocks 635*b*. Each of the number of Z-factor left shift MUX blocks 635 is configured to receive Min/Next Min selection & sums and apply a Z-factor left shift MUX operation to the received Min/Next Min selection & sums.

The serial-v LDPC CRISP 600 is configured to generate a set of output data (e.g., extrinsic outputs). Each of a number of write switch blocks 640*a* is configured to write the output data of the write switch blocks 635 to at least one of a plurality of extrinsic memory units 645 and the plurality of memory banks 605. In some embodiments, a first write switch block 640*a* is configured to write the output data to the plurality of extrinsic memory units 645 while a second write switch block 640*b* is configured to write the output data to the plurality of memory units 605.

The plurality of extrinsic memory units 645 is configured to store the extrinsic outputs. In some embodiments, each memory bank 645 includes six (6) memories (not specifically illustrated). In some embodiments, the plurality of extrinsic memory units 645 includes twenty-four (24) memory banks. Depending upon the block size, data may be distributed to different memory units 645. The plurality of extrinsic memory units 645 also is coupled to the extrinsic/row subtractor block 610 such that the read switch 315 can read the extrinsic outputs. Thereafter, the extrinsic/row subtractor block 610 is configured to remove at least a portion of extrinsic data stored in the extrinsic memory units 645 by write switch 640. The serial-v LDPC CRISP 600 is, thus, able to perform a number of iterations of the received data. The extrinsic memory units 645 are configured such that at least one extrinsic memory unit 645*a* outputs twenty-four (24) data in a cycle concurrently.

The serial-v LDPC CRISP 600 is configured to perform serial-v full Z partial row. Serial-v full Z partial row means that, per cycle, the entire Z-factor rows are processed, but only for some of the columns in the row. The serial-v LDPC CRISP 600 also can be configured to perform serial-v full/partial row partial Z processing. Serial-v full/partial row partial Z processing means that, per cycle, only part or a whole number of columns are processed with part of the Z-factor rows. Although, serial-v full/partial row partial Z processing can be utilized for IEEE 802.16e, 4G or DVB-S2, serial-v full/partial row partial Z processing is better suited for IEEE 802.16e. The serial-v LDPC CRISP 600 is designed as a flexible Z-factor LDPC. For standards that have a small number of columns and small value for $W_r$ (e.g., number of "1's" per row) and require a wide range of Z-factors, such as WiMax rate ½ code (where the number of columns=24 and $W_r$=7), serial-v full/partial row partial Z architecture fits well. However, for H-matrices who have high number of columns and/or a high value for $W_r$, serial-v full/partial row partial Z architecture results in a high gate area due to the high level of multiplexing that is required. In these cases it is better to use the serial-v partial row full Z processing architecture. For example, WiMax rate ⅚ code requires a $W_r$=20 with twenty-four (24) columns. Therefore, twenty (20) columns of the twenty-four (24) are selected. In another example, 4G rate ⅚ code requires a $W_r$=22 with one-hundred ninety-two (192) columns. Therefore, twenty-two (22) columns of the one-hundred ninety-two (192) are selected. $W_r$ defines how many cycles per row it will take to finish one row of Z-factor data based on $W_r$/(No. of units) (e.g., set of twenty-four data for Z-factor=24).

Figure 7:
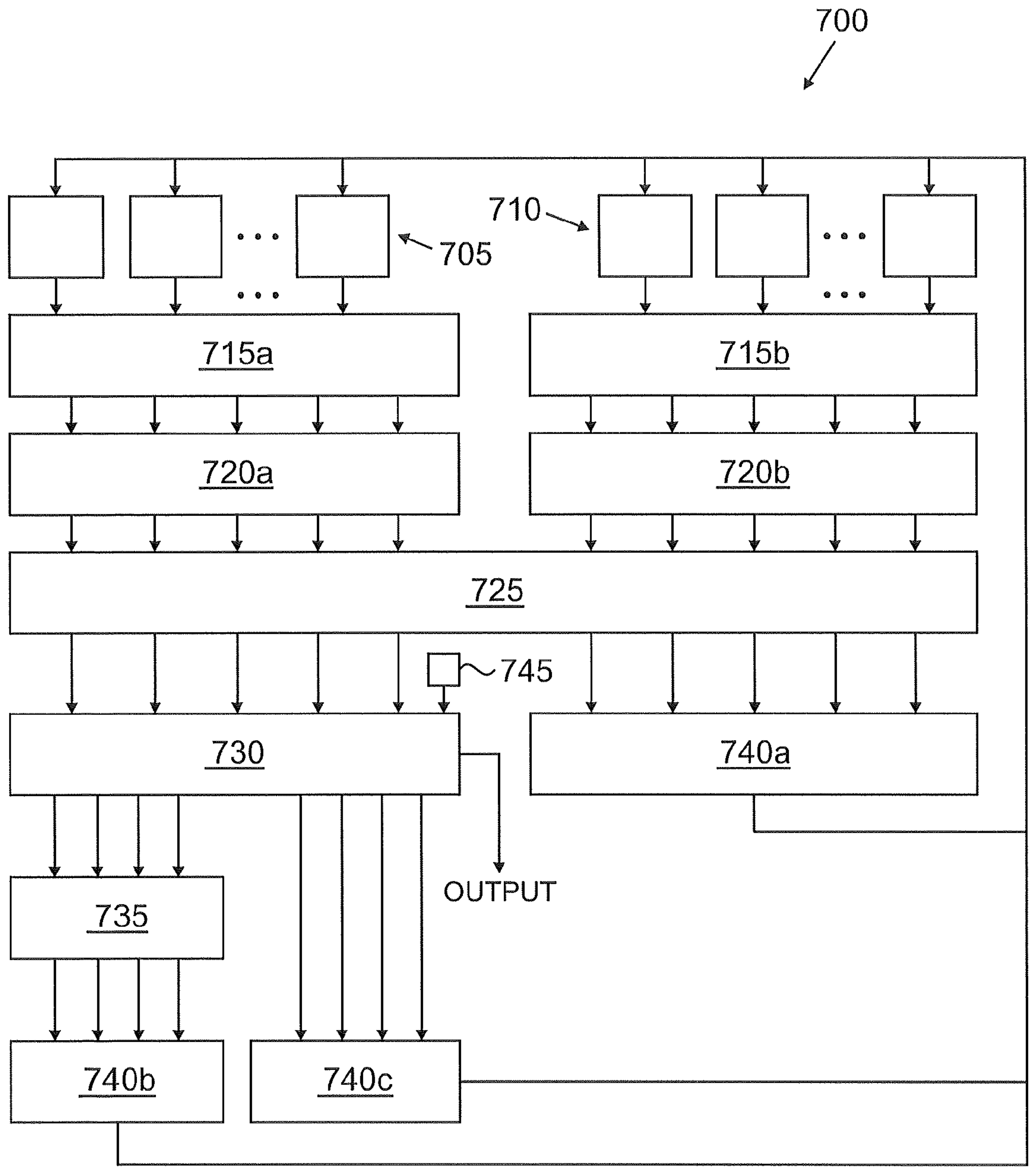
FIG. 7 illustrates a more detailed block diagram of an exemplary serial-c LDPC CRISP according to embodiments of the present disclosure.

FIG. 7 illustrates a more detailed block diagram of an exemplary serial-c LDPC CRISP according to embodiments of the present disclosure. The embodiment of the serial-c LDPC CRISP 700 shown in FIG. 7 is for illustration only. Other embodiments of the serial-c LDPC CRISP 700 could be used without departing from the scope of this disclosure.

The serial-c LDPC CRISP 700 includes a plurality of memory units 705 and a plurality of extrinsic memory units 710. In some embodiments, the serial-c LDPC CRISP 700 includes thirty (31) memory units 705. The memory units 705 are configured to store values (a, b, c, d, e, f) received via the receive path (discussed herein above with respect to FIG. 2B). Depending upon the block size, data may be distributed to different memory units 705. Further, the input value "f" is loaded into a register (not shown). In some embodiments, each memory unit 705 includes six (6) memories (not specifically illustrated).

The plurality of extrinsic memory banks 710 is configured to store the extrinsic outputs. In some embodiments, each extrinsic memory units 710 includes six (6) memory banks (not specifically illustrated). In some embodiments, the plurality of extrinsic memory units 710 includes thirty-one (31) memory units. Depending upon the block size, data may be distributed to different memory units 710. The plurality of extrinsic memory units 710 also is configured to receive data (e.g., extrinsic outputs) only from write switch 740. The serial-c LDPC CRISP 700 is, thus, able to perform a number of iterations of the received values.

The serial-c LDPC CRISP 700 also includes a number of 32-to-6 read switches 715. The read switches 715 are configured to read the received values from the memory units 705 and extrinsic memory units 710. Further, the serial-c LDPC CRISP 700 includes a number of Z-factor right shift MUX blocks 720, a processor array 725, an addition subtraction block 730, a minimum detection block 735, the write blocks 740 and a input mem block 745.

In a first iteration, the read switches 715 select and compare the read values with values in a register "f" (not shown). The processor 720 performs a minimum detection operation. The write block 740*a* writes a minimum value (e, f) back to the register and uses this value to overwrite the value "e" in the extrinsic memory 710. Thereafter, the write block 740*a* writes another min (d, e, f) back to the register and the extrinsic memory 710. The write block 740*a* continues this process until the values in the extrinsic memory 710 include min (b, c, d, e, f), min (c, d, e, f), min (d, e, f), min (e, f) and "f".

In a second iteration, a new check node value "a1" is derived from min (b, c, d, e, f). An output corresponding to value "a" can be found in this step. The write blocks 740 write a1 to the register and to extrinsic memory 710 by overwriting the old value of "a". Thereafter, a new check node value b1 is found from a1 and min (c, d, e, f). An output corresponding to value "b" can be found in this step. The write blocks 740 write b1 to the register and to extrinsic memory 710 by overwriting the old value of "b". This process is repeated until a new check node value "f1" is determined. Further, in some embodiments, the serial-c LPDC decoder 700 is configured to repeat the initialization and serial-c for a second iteration. In such embodiments, the initial values for the first half iteration are a1, b1, c1, d1, e1 and f1.

Figure 8:
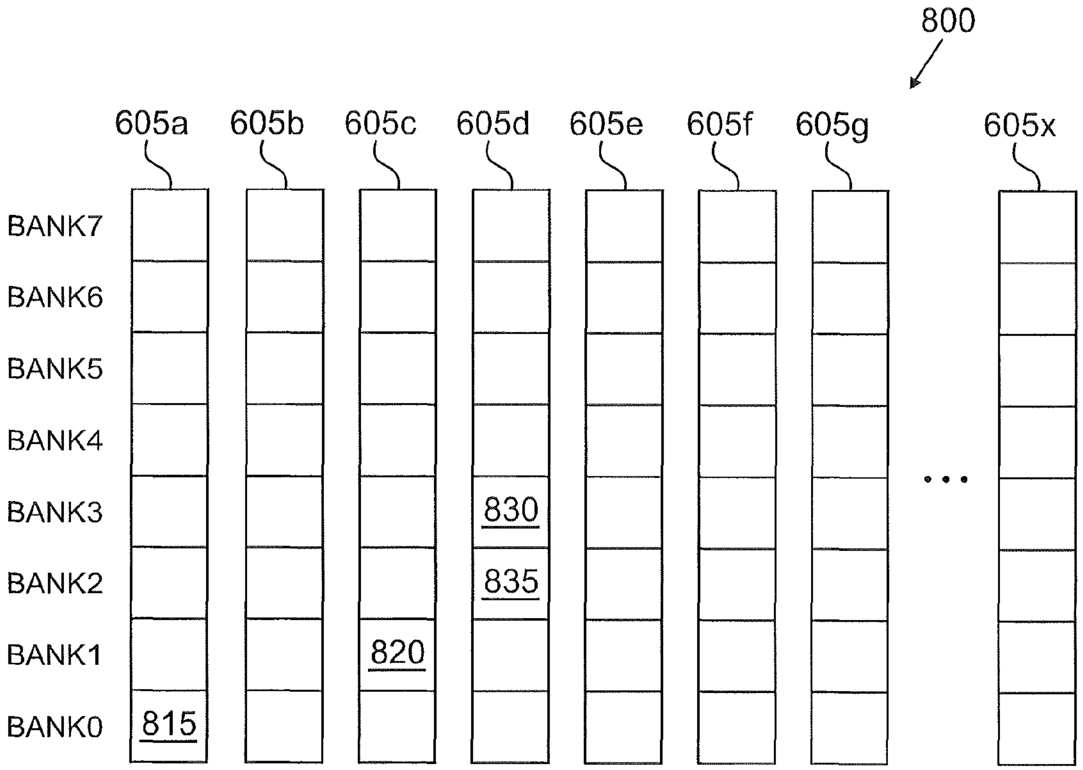
FIG. 8 illustrates an exemplary 4G memory array 800 according to embodiments of the present disclosure.

FIG. 8 illustrates an exemplary 4G memory array 800 according to embodiments of the present disclosure. The embodiment of the memory array 800 shown in FIG. 8 is for illustration only. Other embodiments of the memory array 800 could be used without departing from the scope of this disclosure.

Memory array 800 includes the same general structure as any one or more of the input buffer 310, the memory 605, extrinsic memory 645, memory 705 and extrinsic memory 710. The 4G memory array 800 is adapted for use in IMT-Advanced standards. However, embodiments wherein 4G memory array 800 is used for WiMax, DVB-S2 or any other wireless communication standard are within the scope of this disclosure.

The 4G memory array 800 includes twenty-four memory units 805*a*-805*x*. Each memory unit 805*a*-805*x* includes eight (8) memory banks (bank0-bank7).

The 4G memory array 800 is configured to couple to a ⅔-unit LPDC decoder CRISP. A ⅔-unit LPDC decoder CRISP 300 comprises four processor element arrays. The ⅔-unit LDPC decoder CRISP 300 can be configured as, but not limited to, the serial-v LPDC CRISP 600 or the serial-c LPDC CRISP 700. The ⅔-unit LPDC decoder CRISP 300 is configured to implement one, two or four processing elements.

A 4G H-matrix includes one hundred ninety-two (192) columns. As such, using ⅚ rate code, the H-matrix is 4608×768. Therefore, a ⅔-unit LDPC CRISP 300 is configured to received 4608 bits per frame under the 4G standard.

The 4G H-matrix columns are divided into the eight (8) banks in each of the twenty four (24) columns of the 4G memory array 800. The ⅔-unit LDPC decoder CRISP 300 accesses (e.g., Read and Write operation) each bank (bank0-bank7) in a different cycle. The ⅔-unit LDPC decoder CRISP 300 is configured to access all the memory units 805*a*-805*x* simultaneously (e.g., all twenty-four memory units 805*a*-805*x* accessed at once) such that each contains twenty four (24) 8-bit inputs and 16-bit extrinsic data.

Each bank (bank0-bank7) corresponds to five-hundred seventy-six (576) bits of data. For example bank0 corresponds to five-hundred seventy-six (576) bits of data stored in memory units 805*a*-805*x*. Since each bank (bank0-bank7) corresponds to five-hundred seventy-six (576) bits of data, 4G memory array is configured to store 4608 bits of data.

In some embodiments, the 4G array is configured to store more than 4608 bits of data depending on the constellation utilized. The 4G memory 800, and by association, the LDPC decoders (e.g., ⅔ unit decoder 300 and 600 and parallel ⅔ unit decoder 1000 and 1100) discussed herein, support any size H-matrix dimension with any $W_r$ and $W_c$ by adjusting to architecture of the 4G memory 800 to include more memory units 805 or more banks.

In some embodiments, data can be written into each 4G memory array 800 one bank at a time. For example, bank0 is written prior to bank1. In additional and alternative embodiments, data can be read from multiple banks simultaneously. In such embodiments, data can be read simultaneously from memory unit 805*a* bank0 810 and memory unit 805*c* bank1 820. However, in such embodiments, data cannot be read from two banks in the same memory unit. For example, data cannot be read simultaneously from 830 and 835.

Figure 9:
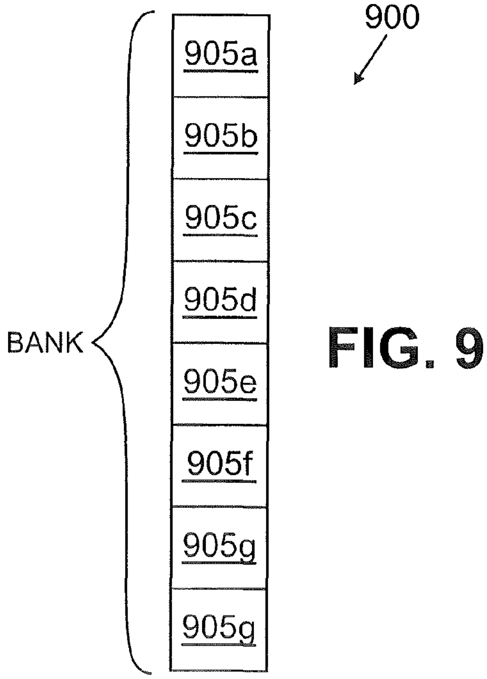
FIG. 9 illustrates an exemplary row extrinsic memory arrangement according to embodiments of the present disclosure.

FIG. 9 illustrates an exemplary row extrinsic memory arrangement according to embodiments of the present disclosure. The embodiment of the row extrinsic memory arrangement 900 shown in FIG. 9 is for illustration only. Other embodiments of the row extrinsic memory arrangement 900 could be used without departing from the scope of this disclosure.

The row extrinsic memory 900 illustrates an exemplary memory unit 805 bank. For example, row extrinsic memory 900 can correspond memory unit 805*a* bank0 815. The row extrinsic memory 900 includes eight (8) rows 905*a*-905*h*. The row extrinsic memory 900 saves all temporal row extrinsics. The size of the row extrinsic memory 900 depends on the max $W_c$ of the H-matrix. For 4G and WiMax, the max $W_c$ equals six ($W_c$=6) which means the row extrinsic memory 900 should be six times larger than the input/extrinsic size. For example each set of data (e.g., set of twenty-four data) can be used in six different equations. FIG. 9 illustrates a max $W_c$ equal to eight ($W_c$=8). For example each set of data (e.g., set of twenty-four data) can be used in eight different equations. As such, each memory unit 805 bank illustrated in FIG. 8 contains eight (8) rows 905*a*-905*h* for row extrinsic data of 24×16-bits.

In some embodiments, multiple ⅔-unit LDPC CRISPs 300 are used in parallel to perform high bit rate LDPC decoding operations. In such embodiments, the multiple ⅔-unit LDPC CRISPs 300 can be configured to utilize at least one of several approaches including, but not limited to, independent row processing, pipelined processing and parallel column processing.

Figure 10:
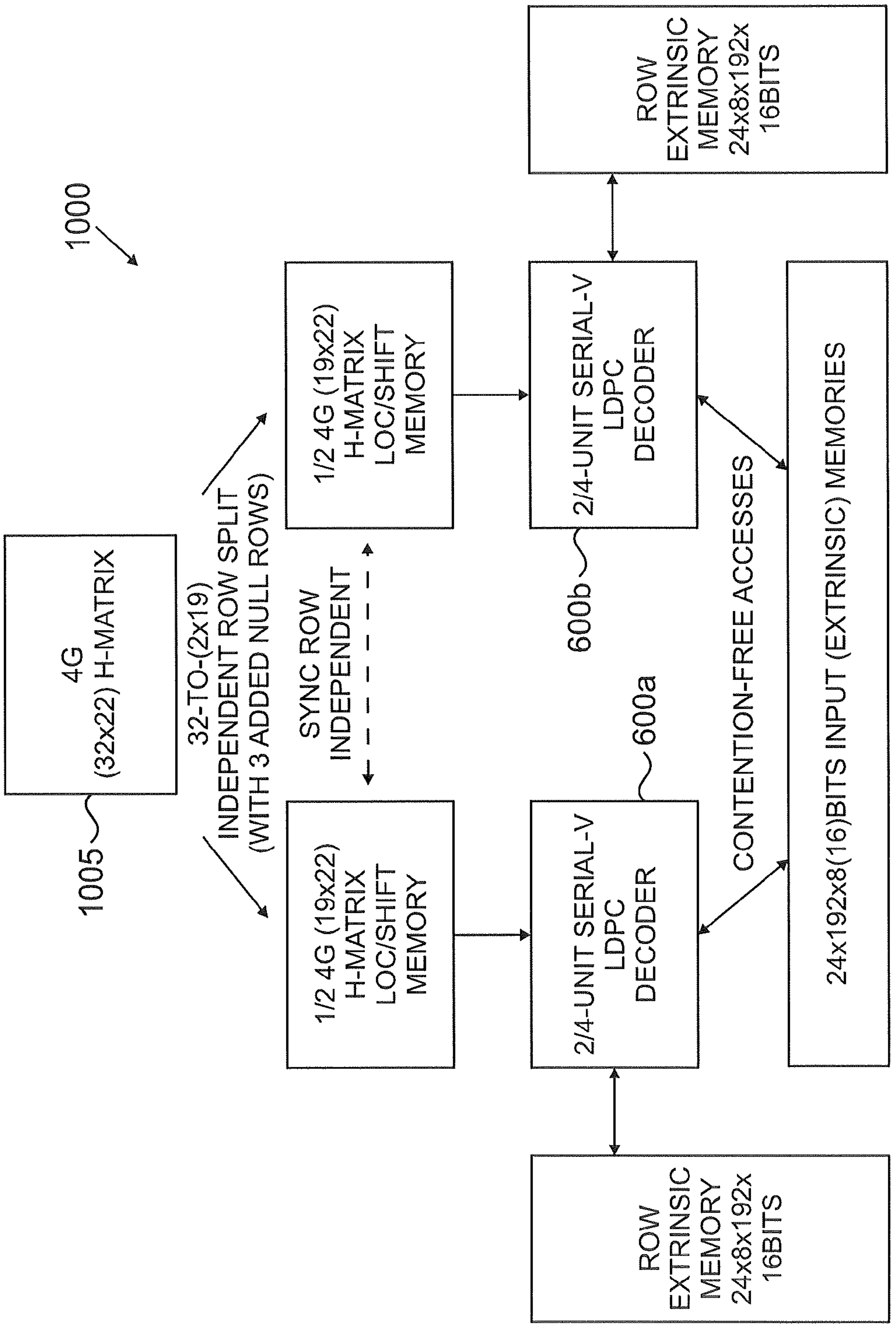
FIG. 10 illustrates a parallel ⅔-unit LDPC decoder according to embodiments of the present disclosure.

FIG. 10 illustrates a parallel ⅔-unit LDPC decoder according to embodiments of the present disclosure. The embodiment of the parallel ⅔-unit LDPC decoder 1000 shown in FIG. 10 is for illustration only. Other embodiments of the parallel ⅔-unit LDPC decoder 1000 could be used without departing from the scope of this disclosure.

The parallel ⅔-unit LDPC decoder 1000 is operable to read and process two sets of data simultaneously. The process utilized by the parallel ⅔-unit LDPC decoder 1000 includes functions similar to those outlined with respect to the ⅔-unit LDPC CRISP 600 illustrated in FIG. 6. However, since the parallel ⅔-unit LDPC decoder 1000 comprises two ⅔-unit LDPC CRISPs 600, the parallel 2/4-unit LDPC decoder 1000 is operable to process two sets of twenty-four data simultaneously.

For example, the first 2/4-unit LDPC CRISP 600*a* reads data from memory 605 during time $t_1$. As illustrated with respect to FIG. 6, each of the processors in the processor array 625 of the parallel 2/4-unit LDPC decoder 1000 is configured to read from each of the memory units 605*a*-605*x* such that the data stored in one of the memory units 605*a*-605*x* is processed using a different equation simultaneously. The processors from the first 2/4-unit LDPC CRISP 600*a* read data from the second memory unit 605*b* at the time $t_1$ such that a first processor reads data from the second memory unit 605*b* at the time $t_1$; a second processor reads the data from the second memory unit 605*b* at the time $t_1$; a third processor will read the data from the second memory unit 605*b* at the time $t_1$, etc.

Additionally, the second 2/4-unit LDPC CRISP 600*b* also reads data from memory 605 during time $t_1$. The second 2/4-unit LDPC CRISP 600*b* reads data from the third memory unit 605*b* at the time $t_1$ such that the first processor reads data from the third memory unit 605*c* at a time $t_1$; the second processor reads the data from the third memory unit 605*c* at the time $t_1$; the third processor will read the data from the third memory unit 605*c* at the time $t_1$, etc.

As such, the first 2/4-unit LDPC CRISP 600*a* and the second 2/4-unit LDPC CRISP 600*b* read data from memory units 605*b* and 605*c* (e.g., equations corresponding to values "94" and "73" from the H-matrix 500 for data previously received into memory 605) simultaneously. Since each 2/4-unit LDPC CRISP 600 can process twenty-four bits of data per cycle, the parallel 2/4-unit LDPC decoder 1000 is operable to process forty-eight (48) bits of data per cycle.

In the embodiments wherein the memory units 605*a*-605*x* comprise multiple banks, the multiple processors for the first 2/4-unit LDPC CRISP 600*a* and the second 2/4-unit LDPC CRISP 600*b* read only from one bank in a memory unit 605 at a time. For example, the 2/4-unit LDPC CRISPs 600*a* and 600*b* read from one bank (e.g., bank0) at the time $t_1$ and read from the next bank (e.g., bank1) at a subsequent time, e.g., after all data from bank0 has been read from each of the memory units 605*a*-605*x*.

In some embodiments, the parallel 2/4-unit LDPC decoder 1000 is operable to perform LDPC decoding using Independent Rows processing. The parallel 2/4-unit LDPC decoder 1000 includes a first 2/4-unit LDPC CRISP 600*a* and a second 2/4-unit LDPC CRISP 600*b*.

In such embodiments, a 4G rate 5/6H-matrix 1005 is a 32×22 matrix. The 4G rate 5/6H-matrix 1005 undergoes a 32-to-(2×19) Independent Row split operation. In the Independent Row split operation, three (3) null rows are added. The independent rows are processed in parallel by the first 2/4-unit LDPC CRISP 600*a* and the second 2/4-unit LDPC CRISP 600*b*.

Figure 11:
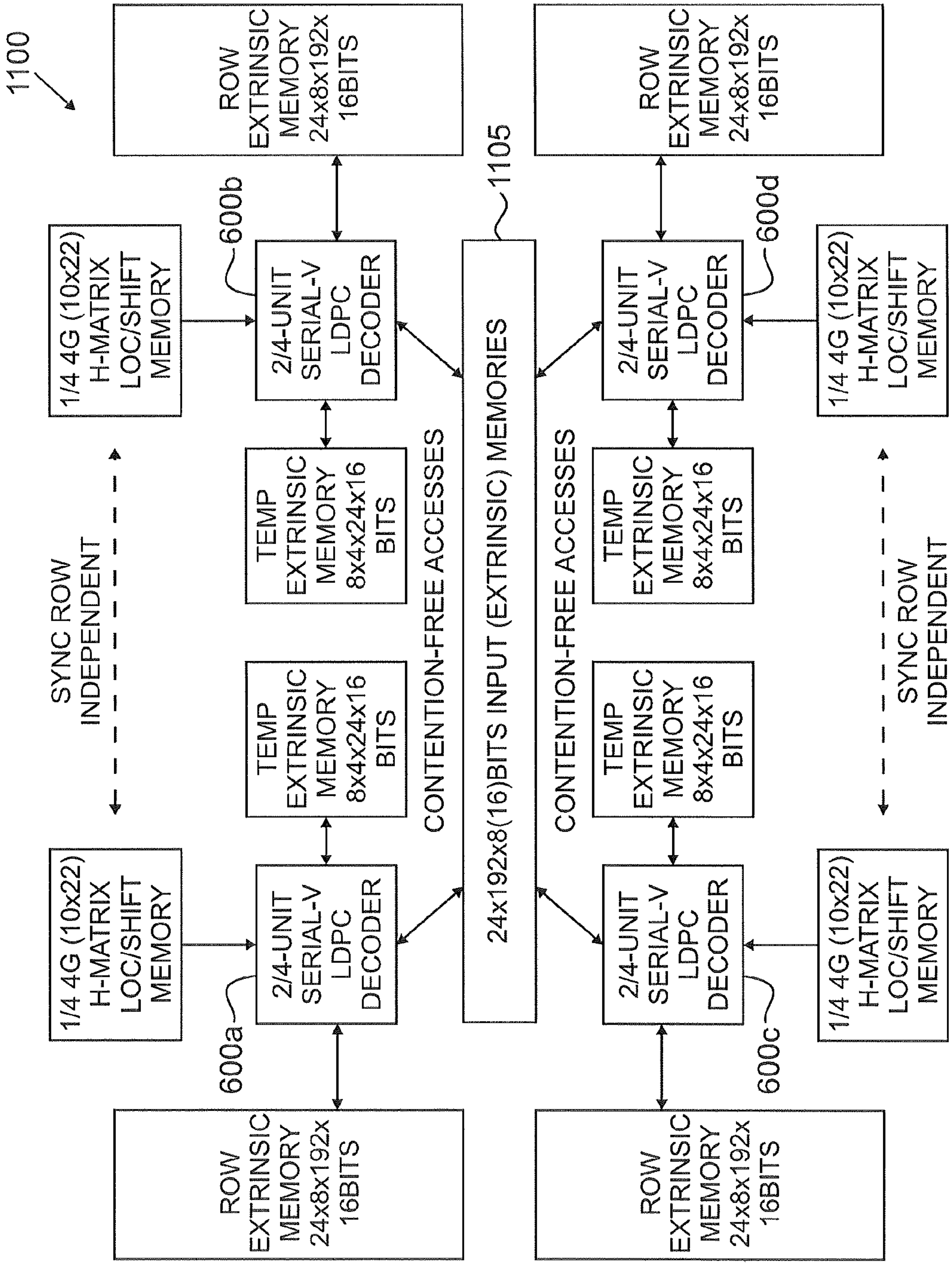
FIG. 11 illustrates a multiple parallel ⅔-unit LDPC decoder according to embodiments of the present disclosure.

FIG. 11 illustrates a multiple parallel 2/4-unit LDPC decoder according to embodiments of the present disclosure. The embodiment of the multiple parallel 2/4-unit LDPC decoder 1100 shown in FIG. 11 is for illustration only. Other embodiments of the multiple parallel 2/4-unit LDPC decoder 1100 could be used without departing from the scope of this disclosure.

The multiple parallel 2/4-unit LDPC decoder 1100 is operable to read and process four sets of data simultaneously. The process utilized by the multiple parallel 2/4-unit LDPC decoder 1100 includes functions similar to those outlined with respect to the 2/4-unit LDPC CRISP 600 illustrated in FIG. 6. However, since the multiple parallel 2/4-unit LDPC decoder 1100 comprises four 2/4-unit LDPC CRISPs 600, the multiple parallel 2/4-unit LDPC decoder 1100 is operable to process four (4) sets of twenty-four (24) data simultaneously.

For example, a first 2/4-unit LDPC CRISP 600*a* reads data from memory 605 during time $t_1$. As illustrated with respect to FIG. 6, each of the processors in the processor array 625 of the multiple parallel 2/4-unit LDPC decoder 1100 is configured to read from each of the memory units 605*a*-605*x* such that the data stored in one of the memory units 605*a*-605*x* is processed using a different equation simultaneously. The processors from the first 2/4-unit LDPC CRISP 600*a* read data from the second memory unit 605*b* at the time $t_1$ such that a first processor reads data from the second memory unit 605*b* at the time $t_1$; a second processor reads the data from the second memory unit 605*b* at the time $t_1$; a third processor will read the data from the second memory unit 605*b* at the time $t_1$, etc.

Additionally, a second 2/4-unit LDPC CRISP 600*b* also reads data from memory 605 during time $t_1$. The second 2/4-unit LDPC CRISP 600*b* reads data from the third memory unit 605*c* at the time $t_1$ such that the first processor reads data from the third memory unit 605*c* at a time $t_1$; the second processor reads the data from the third memory unit 605*c* at the time $t_1$; the third processor will read the data from the third memory unit 605*c* at the time $t_1$, etc.

Further, a third 2/4-unit LDPC CRISP 600*c* also reads data from memory 605 during time $t_1$. The third 2/4-unit LDPC CRISP 600*c* reads data from the ninth memory unit 605*i* at the time $t_1$ such that the first processor reads data from the ninth memory unit 605*i* at a time $t_1$; the second processor reads the data from the ninth memory unit 605*i* at the time $t_1$; the third processor will read the data from the ninth memory unit 605*i* at the time $t_1$, etc.

A fourth 2/4-unit LDPC CRISP 600*d* also reads data from memory 605 during time $t_1$. The fourth 2/4-unit LDPC CRISP 600*d* reads data from the tenth memory unit 605*j* at the time $t_1$ such that the first processor reads data from the tenth memory unit 605*j* at a time $t_1$; the second processor reads the data from the tenth memory unit 605*j* at the time $t_1$; the third processor will read the data from the tenth memory unit 605*j* at the time $t_1$, etc.

As such, the 2/4-unit LDPC CRISPs 600*a*, 600*b*, 600*c* and 600*d* simultaneously read data from memory units 605*b*, 605*c*, 605*i* and 605*j* (e.g., equations corresponding to values "94", "73", "55" and "83" from the H-matrix 500 previously for data received into memory) respectively. Since each 2/4-unit LDPC CRISP 600 can process twenty-four bits of data per cycle, the multiple parallel 2/4-unit LDPC decoder 1100 is operable to process ninety-six (96) bits of data per cycle.

In the embodiments wherein the memory units 605*a*-605*x* comprise multiple banks, the multiple processors for the multiple parallel 2/4-unit LDPC decoder 1100 read only from one bank in a memory unit 605 at a time. For example, the 2/4-unit LDPC CRISPs 600*a* and 600*b* read from one bank (e.g., bank0) at the time $t_1$ and read from the next bank (e.g., bank1) at a subsequent time, e.g., after all data from bank0 has been read from each of the memory units 605*a*-605*x*.

In some embodiments, the multiple parallel 2/4-unit LDPC decoder 1100 is operable to perform LDPC decoding using Pipelined processing. Each 2/4-unit LDPC CRISP 300 processes a 1/4 4G H-matrix. Pipelined processing can be applied to any number of machines (up to the number of columns divided by the number of units per LDPC machine). Each machine (e.g., each 2/4-unit LDPC CRISP 600) processes 2/4 columns of Z-factor of rows per cycle. For each machine, it takes x cycles for reading the extrinsics and x cycles to write the newly calculated extrinsic per row. The pipelining occurs when one 2/4-unit LDPC CRISP 600 (e.g., 2/4-unit LDPC CRISP 600) completes y cycles of writing the previous row; the next 2/4-unit LDPC CRISP 600 (e.g., 2/4-unit LDPC CRISP 600*b*) will start reading the next row. The process continues with each machine reading the next row after a prior machine has written the previous row.

In some embodiments, a parallel column (banks) processing is utilized by the multiple parallel 2/4-unit LDPC decoder 1100. The multiple parallel 2/4-unit LDPC decoder 1100 is configured to use the parallel columns processing method and the pipelined processing method together. In such embodiments, the multiple parallel 2/4-unit LDPC decoder 1100 passes the Min value between the machines in parallel columns (e.g., between the first 2/4-unit LDPC CRISP 600*a* and the third 2/4-unit LDPC CRISP 600*c* and between the second 2/4-unit LDPC CRISP 600*b* and the fourth 2/4-unit LDPC CRISP 600*d*). The Input/Extrinsic memories 1105 are divided between the 2/4-unit LDPC CRISPs 600*a*-600*d* based on the range of banks each 2/4-unit LDPC CRISP 600*a*-600*d* is processing.

Figure 12:
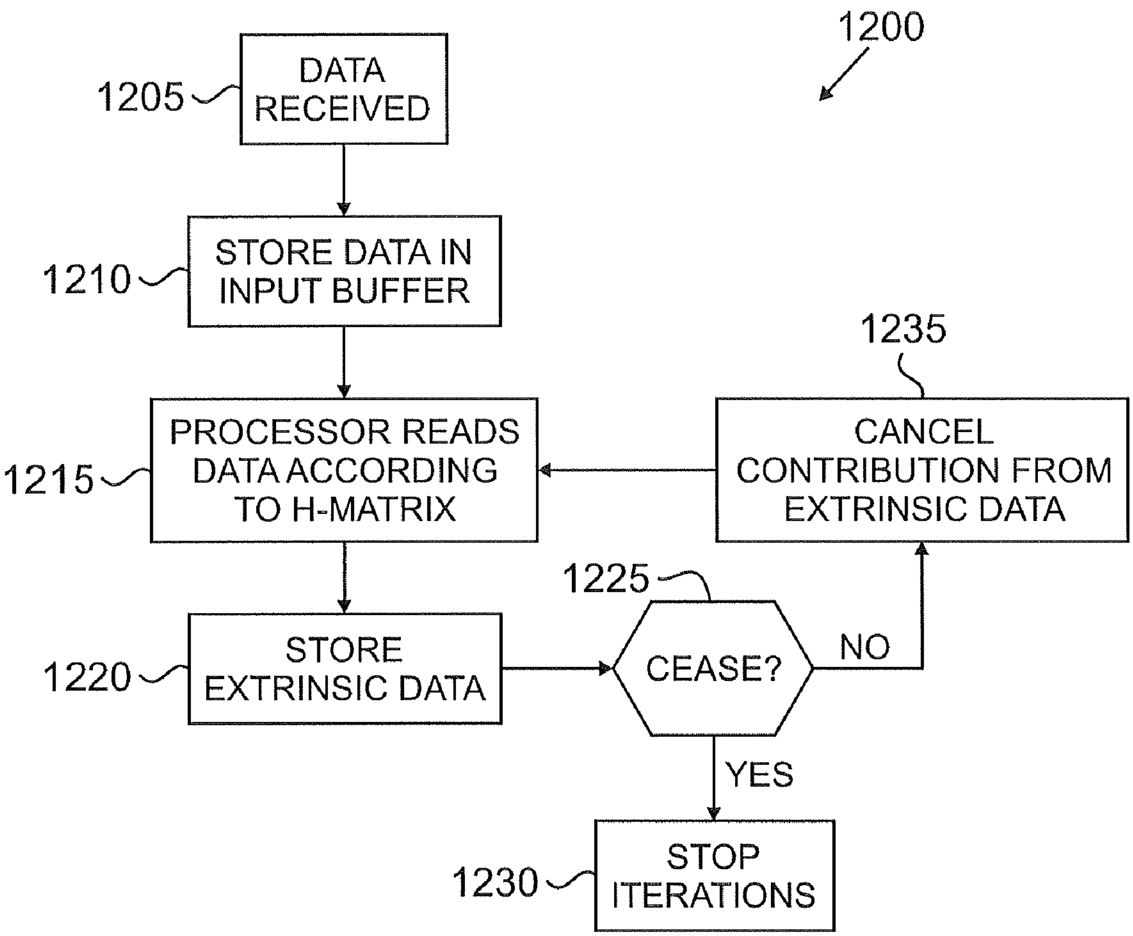
FIG. 12 illustrates a process for LDPC decoding according to embodiments of the present disclosure.

FIG. 12 illustrates a process for LDPC decoding according to embodiments of the present disclosure. The embodiment of the process for LDPC decoding 1200 shown in FIG. 12 is for illustration only. Other embodiments of the process for LDPC decoding 1200 could be used without departing from the scope of this disclosure.

Data is received into the receive path in step 1205. A codeword is received. The data is received and stored in input buffer 305 in step 1210. In some embodiments, the input buffer 305 includes multiple memory units 605. In one such embodiment, the input buffer includes twenty-four (24) memory units 605*a*-605*x*. In such embodiment, the input buffer 305 can store five-hundred seventy-six (576) bits per frame.

In step 1215, the processor array 320 processes the data in the input buffer 305. The processor array 320 applies the H-matrix to the data in the input buffer 305. In order to process the data according to the H-matrix, the read switch 315 reads the data from the input buffer 305. The read switch 315 includes the extrinsic/row extrinsic subtractor 610, 24-to-2(4) read switch 615 and a Z-factor shift MUX 620. The read switch 305 reads the data and applies a Z-factor right shift according to the H-matrix. For example, the read switch 305 may use H-matrix 500 stored in instruction decoder & address generator 305. The read switch 320 reads data bits 24-47, 48-71, 192-215 and 216-239 as dictated by the H-matrix 500. As stated herein above with respect to FIGS. 5 and 6, data bits 24-47 correspond to the location value "94"; data bits 48-71 correspond to the location value "73"; data bits 192-215 correspond to the location value "55"; data bits 216-239 correspond to the location value "83"; data bits 288-311 (e.g., redundancy bits) correspond to the location value "7"; and data bits 312-335 (e.g., redundancy bits) correspond to the location value "0"; while "−1" values indicate a zero (e.g., non-used) position.

In some embodiments, the decoder 280 includes one 2/4-unit LDPC CRISP 300. In such embodiment, the read switch reads the data bits 24-47 during time $t_1$; data bits 48-71 during time $t_2$; data bits 192-215 during time $t_3$; data bits 216-239 during time $t_4$; data bits 288-311 during time $t_5$; and data bits 312-335 during time $t_6$.

In some embodiments, the decoder 280 includes two 2/4-unit LDPC CRISPs 300. In such embodiment, the read switch reads the data bits 24-47 and 48-71 during time $t_1$; data bits 48-71 and 192-215 during time $t_2$; and data bits 288-311 and 312-335 during time $t_3$.

In some embodiments, the decoder 280 includes four 2/4-unit LDPC CRISPs 300. In such embodiment, the read switch reads the data bits 24-47, 48-71, 48-71 and 192-215 during time $t_1$; and data bits 288-311 and 312-335 during time $t_2$.

The processor array 320 performs a min-sum operation to identify a min and next value. The min and next min values are written into one or more registers in the processor array 320.

Thereafter, the write switch 335 writes the results from the processor array 320 operation into extrinsic buffer 330 in step 1220. The write switch includes the min/next min selection & sum blocks 630, the Z-factor left shift MUX's 635 and the 2(4)-to-24 write switch 640. The processor array 320 writes one value of the extrinsic data to the extrinsic memory 330 via a path defined by min/next min selection & sum blocks 630*a*, the Z-factor left shift MUX's 635*a* and the 2(4)-to-24 write switch 640*a*. Additionally, the processor applies the extrinsic data to the next iteration via a path defined by min/next min selection & sum blocks 630*b*, the Z-factor left shift MUX's 635*b* and the 2(4)-to-24 write switch 640*b*.

The extrinsic buffer 330 includes the extrinsic memory units 645. In some embodiments, the extrinsic buffer 330 includes multiple extrinsic memory units 645. In one such embodiment, the extrinsic buffer 330 includes twenty-four (24) extrinsic memory units 645*a*-645*x*. In such embodiment, the extrinsic buffer 330 can store five-hundred seventy-six (576) bits.

In step 1225 the decoder 280 determines if a ceasing event has occurred. A ceasing event is an event that instructs the decoder 280 to stop performing iterations of the data. The ceasing event can include, but is not limited to, a number of iterations performed, a duration of time, a convergence of the data detected, and a most significant bit obtained. If the decoder determines that the ceasing event has occurred, the process stops in step 1230. Otherwise, the process moves to step 1235.

In step 1235, the read switch 315 reads the data from the extrinsic buffer 330. The extrinsic/row extrinsic subtractor 610 is operable to remove extrinsic data corresponding to a v-node to be processed by the processor array 320. The extrinsic data corresponding the v-node is removed such that extrinsic data does not contribute the calculations to determine a new value for that v-node. The extrinsic/row extrinsic subtractor 610 performs this operation for each data bit in the extrinsic buffer 300. The extrinsic/row extrinsic subtractor 610 extrinsic data read from extrinsic memory 330 and received via the path defined by min/next min selection & sum blocks 630*b*, the Z-factor left shift MUX's 635*b* and the 2(4)-to-24 write switch 640*b*.

Thereafter, the processor array 320 performs another decoding iteration by returning to step 15. It will be understood that, in the second and subsequent iterations, the data is not read from the input buffer 305. Rather, the data is read from the extrinsic buffer 330 (as processes by extrinsic/row extrinsic subtractor 610). Therefore, the processor array 320 writes one value of the extrinsic data to the extrinsic memory 330 via a path defined by min/next min selection & sum blocks 630*a*, the Z-factor left shift MUX's 635*a* and the 2(4)-to-24 write switch 640*a*. Additionally, the extrinsic data is applied to the next iteration via a path defined by min/next min selection & sum blocks 630*b*, the Z-factor left shift MUX's 635*b* and the 2(4)-to-24 write switch 640*b*.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a receiver configured to decode encoded transmissions, the receiver comprising:

a number of receive antennas; and a low density parity check decoder, the low density parity check decoder comprising:

a plurality of memory units, a plurality of processors, and a programmable finite state machine configured to control a reconfigurable data path, wherein the programmable finite state machine is configured to execute a plurality of context-related instructions associated with the low density parity check decoder such that the low density parity check decoder is configured to perform low density parity check decoding operation.

2. The receiver as set forth in claim 1, wherein plurality of memory units is configured to receive and store at least 576 data bits per transmission frame based on a Z factor.

3. The receiver as set forth in claim 2, wherein the plurality of memory units comprises twenty-four memory units.

4. The receiver as set forth in claim 1, wherein the low density parity check decoder is configured to perform a number of computation iterations until a ceasing event occurs.

5. The receiver as set forth in claim 1, wherein the plurality of processors is configured to simultaneously execute a number of calculations on all the data stored in one memory unit of the plurality of memory units.

6. The receiver as set forth in claim 1, the low density parity check decoder further comprising a plurality of extrinsic memory units.

7. The receiver as set forth in claim 1, wherein the low density parity check decoder is configured to decode data received via any one of 802.16e, International Mobile Telecommunications—Advanced, and Digital Video Broadcasting—Satellite—Second Generation.

8. For use in a wireless communications device, a decoder configured to decode encoded transmissions, the decoder comprising:

a plurality of memory units;

a processor array; and a plurality of instructions wherein at least a portion of the plurality of instructions is stored in a instruction controller, the controller configured to control a reconfigurable data path and execute a plurality of context-related instructions in the plurality of instructions to cause the processor array to perform a low density parity check decoding operation.

9. The decoder as set forth in claim 8, wherein the plurality of memory units is configured to receive and store at least 576 data bits per transmission frame based on a Z factor.

10. The decoder as set forth in claim 9, wherein the plurality of memory units comprises twenty-four memory units.

11. The decoder as set forth in claim 10, wherein each of the plurality of memory units comprises eight banks and said plurality of memory units is configured to receive at least 4608 data bits per transmission frame.

12. The decoder as set forth in claim 8, wherein the plurality of processors is configured to simultaneously execute a number of calculations on all the data stored in one memory unit of said plurality of memory units.

13. The decoder as set forth in claim 8, further comprising a plurality of extrinsic memory units.

14. The receiver as set forth in claim 8, wherein the decoder is configured to decode data received via any one of 802.16e, International Mobile Telecommunications—Advanced, and Digital Video Broadcasting—Satellite—Second Generation.

15. A method for decoding transmissions in a wireless communications network, the method comprising:

receiving a data transmission; and performing a low density parity check decoding operations with a reconfigurable decoder, wherein said decoder comprises:

a plurality of memory units, a plurality of processors, and a programmable finite state machine configured to control a reconfigurable data path, wherein the programmable finite state machine is configured to execute a plurality of context-related instructions to cause the reconfigurable decoder to perform the low density parity check decoding operation.

16. The method as set forth in claim 15, wherein receiving comprises receiving and storing in the plurality of memory units at least 576 data bits per transmission frame based on a Z factor.

17. The method as set forth in claim 16, wherein said plurality of memory units comprises twenty-four memory units and storing comprises storing at least twenty four data bits in each one of said plurality of memory units.

18. The method as set forth in claim 15, wherein performing the low density parity check operation comprises performing a number of computation iterations until a ceasing event occurs.

19. The method as set forth in claim 15, wherein performing the low density parity check operation comprises simultaneously executing a number of calculations on all the data stored in one memory unit of the plurality of memory units.

20. The method as set forth in claim 15, wherein receiving comprises receiving data via any one of 802.16e, International Mobile Telecommunications—Advanced, and Digital Video Broadcasting—Satellite—Second Generation.

* * * * *